United States Patent [19]

Takeshita et al.

[11] 4,378,189

[45] Mar. 29, 1983

[54] WAFER LOADING DEVICE

[75] Inventors: Osamu Takeshita, Hikone; Takeshi Takada, Shiga, both of Japan

[73] Assignee: Dainippon Screen Mfg. Co., Ltd., Kyoto, Japan

[21] Appl. No.: 183,803

[22] Filed: Sep. 3, 1980

[30] Foreign Application Priority Data

Sep. 6, 1979 [JP] Japan ................................ 54-115450

[51] Int. Cl.$^3$ ............................................. C23C 13/08
[52] U.S. Cl. .................................. 414/225; 118/500;
118/730; 414/331; 414/737
[58] Field of Search ............... 414/217, 222, 225, 287, 414/331, 404, 416, 417, 737; 118/500, 729, 730

[56] References Cited

U.S. PATENT DOCUMENTS 3,902,615  9/1975  Levy et al. ........................... 414/331
4,208,159  6/1980  Uehara et al. .................. 414/404 X

FOREIGN PATENT DOCUMENTS 54-40068  9/1979  Japan ................................... 118/500

Primary Examiner—Robert G. Sheridan

Attorney, Agent, or Firm—Brumbaugh, Graves, Donohue & Raymond

[57] ABSTRACT

An apparatus to mount wafers for sublimation plating on a rotary type wafer holding dome having more than one wafer mounting seat of window type on its circumference comprising a wafer cassette that holds many sheets of wafers piled up with spacing and holding pieces in-between and is driven up-and-down at the same intervals as wafer mounting, a rotary arm having a sucker on the top end with the said wafer mounting seats on its rotation locus, and a conveyor mechanism to receive a piece of wafer at the end of the wafer cassette and to transfer the wafer to a position on the other rotation locus at the top end of the said rotary arm. The rotation of the wafer holding dome at the same intervals as the wafer mounting seats, up-down motion of the said wafer cassette, the conveyor mechanism and also the rotational driving of the rotary arm are controlled by interlocked sequence to enable automatic and effective loading and unloading between the wafer cassette and wafer holding dome without any contamination or damage to the wafers.

4 Claims, 10 Drawing Figures

WAFER LOADING DEVICE

BRIEF SUMMARY OF THE INVENTION (a) Field of the Invention

This invention relates to wafer loading devices for automatic loading and unloading of wafers between a cassette in which a number of wafers are piled up with equal spacing and a holding dome used for sublimation plating and other treatments.

(b) Background of the Invention

FIG. 1 is a schematic illustration to show the condition of aluminium sublimation plating in wafer treatment process. Wafers(12) are set with the surface to be sublimated facing downward on a disc shape holding dome(11) having a number of stepped circular holes spaced equally on its two concentric circumferences, three such holding domes with wafers mounted are respectively put in contact with a ring guide on their periphery and are supported by the upper ring-form rail through a small sized wheel to which the bearing shafts of the domes(11) are attached. The whole unit is housed in a regular tetrahedron vacuum chamber along the vertical sides of the chamber. When the mounting disc for the said ring guide is turned in the arrow direction after a vacuum is produced in the chamber(14), each one of the said domes(11) revolves while making rotation into the arrow direction. While this motion is continued for a certain time, aluminum evaporates from the molten aluminium crucible placed in the middle of the bottom of the said vacuum chamber and plates out evenly on the furface of the wafer(12) subjected to sublimation plating. Aluminium sublimation plating of a number of sheets of wafers is carried out in this manner simultaneously using the holding domes(11) as the jig in the sublimation plating process of the wafers(12). The wafers(12) which are housed in the cassette(15) shown in FIG. 2, and spaced equally and held by a number of grooves provided at both right and left inner sides of the cassette on their periphery. By conventional methods, the wafers(12) have been taken out of the cassette(15) piece by piece by hand for sublimation treatment to be set on the said holding dome(11), then removed from the holding dome(11) one by one after sublimation treatment to be housed again in the cassette. In handling the wafers, particular attention should be paid to prevention of surface damage and contamination by fat, dust and other contaminants using, for example, a clean absorption tool with fluorine resin treatment. The work by this method was not efficient and it was hard to increase the work speed and to prevent accidental damages such, as dropping of wafers completely, and accordingly, improvement has been demanded.

(c) Objects of the Invention

An object of the present invention is to provide a wafer loading device that ensures efficient and automatic loading of wafers from the wafer cassette to holding domes and that prevents contamination and damage to the wafers and that can be used in place of the conventional manual operation with absorption tools.

Another object of the invention is to provide a wafer loading device that ensures exact rotation indexing of the rotary type wafer holding domes because the wafer setting allowance at the window type wafer mounting seats on the holding domes has to be minimized to make the openings facing to the source of the metal sublimation as large as possible.

A further object of the invention is to provide a wafer loading devices for unloading of wafers from the wafer holding domes to the wafer cassette while receiving the wafers in reverse operation of the table mechanism with the wafer cassette mounted on it, the belt conveyor mechanism, the rotary transfer arm, and of the wafer holding domes.

A still further object of the invention is to provide a wafer loading device for loading of the wafers set in another wafer cassette to the wafer holding domes from which wafers after sublimation plating have been removed following the unloading of the wafers already subjected to metal sublimation plating from the wafer holding domes to the wafer cassette.

DETAILED DESCRIPTION

Construction

Figure 1:
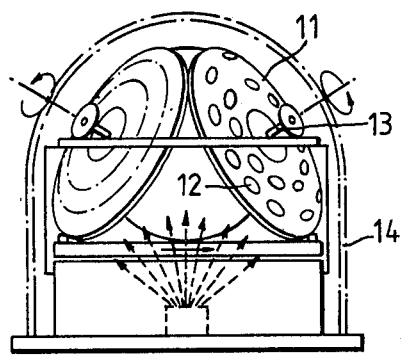
FIG. 1 is the schematic drawing to show the condition of aluminium sublimat,on plating in wafer treatment process.
Figure 2:
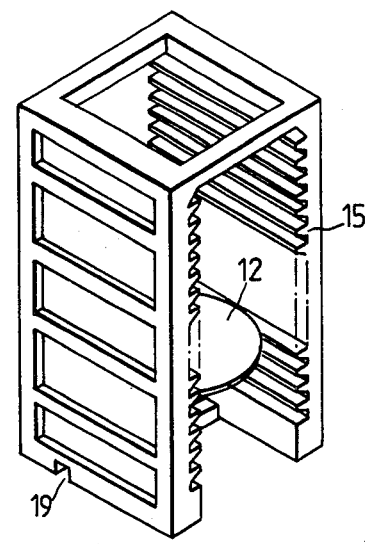
FIG. 2 is the perspective drawing showing an example of cassette to house wafers.
Figure 6:
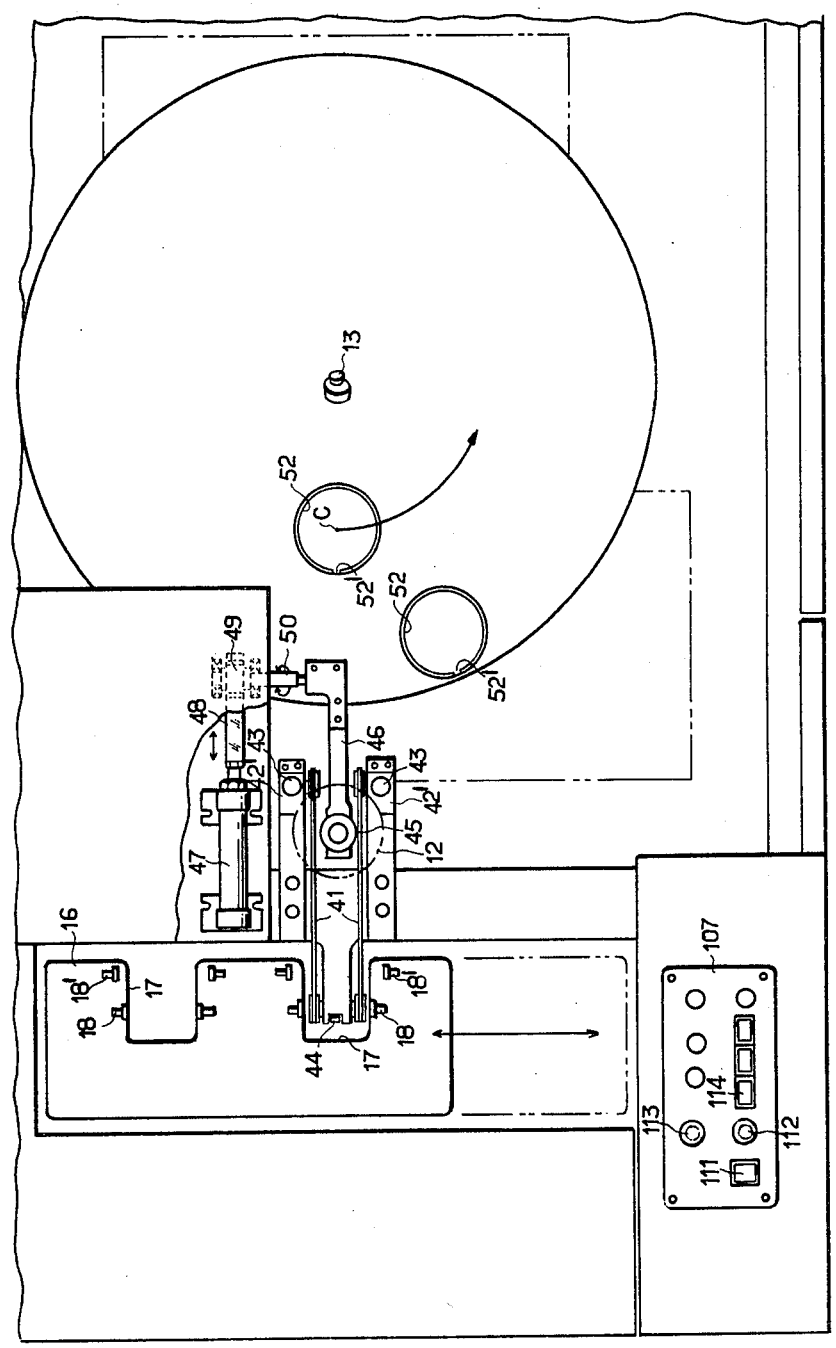
FIG. 6 is the partial top view of the belt conveyor mechanism and rotary transfer arm for taking-out, transfer and positioning of the wafers housed in the cassette.
Figure 7:
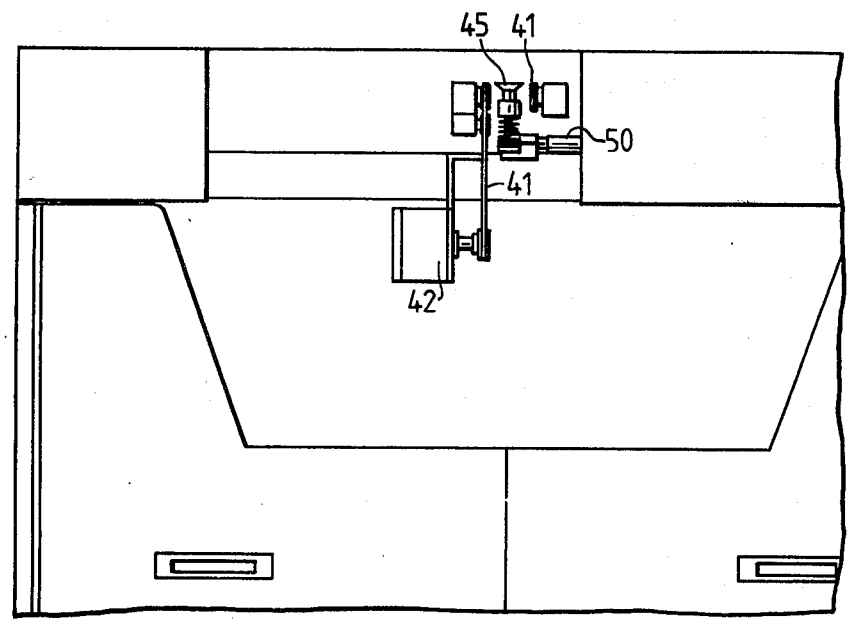
FIG. 7 is the partial front view of the same.

Referring now to the drawings, structure of some embodiments according to this invention is described as follows:

As is detailed in the following text, this apparatus is so composed to enable handling of two different sizes of wafers(12), 4" and 3" in diameter for example, only by replacing a few parts. In this case, the holding domes(11) and the cassette(15) for use shall be suitable to respective sizes. In FIG. 6, (16) is the table on which the cassette (15) of FIG. 2 is mounted, and has a pair of square notches(17) of a considerable size, on the edge of which one pair each of cassette positioning dogs(18)(18') is fixed for front-rear and right-left positioning of the cassette to the table(16) by placing the cassette(15) on the table(16) while fitting the notches(19) at the bottom of the side plates to the dogs. The positioning dogs(18)(18') correspond respectively to 3" cassette and 4" cassette.

Figure 5:
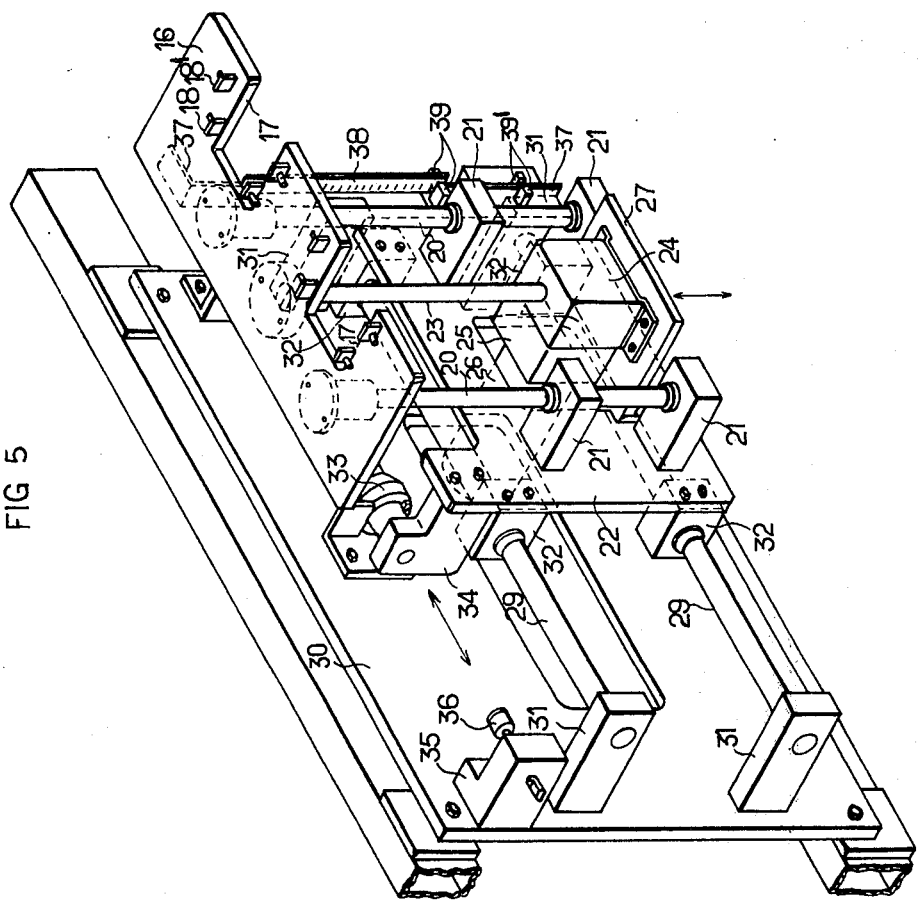
FIG. 5 is the perspective drawing to show the major part of the table mechanism on which the cassette of this device is mounted.

In FIG. 5, (20) is a pair of guide rods for up-down motion, and the top ends are fixed to the back side of the table(16) by using bushing with flanges. At the lower ends and slightly above the ends, the guide rods are provided with ball sliders and are connected to the support arms(21) fixed on the travelling base(22) so as to slide freely. (23) is the driving rod serving as the output shaft of the linear head(24) so arranged to make linear motion by the interlocking of the rack and pinion, the rack being formed on a part of the periphery, and the driving rod is fixed to the back of the table(16) through a flange. To the linear head(24), the motor(26) with magnetic brake is attached via the reduction gear box(25), and the driving rod(23) moves up and down when the motor(26) is rotated to transfer the table(16) upward or downward. The linear head(24) is attached to the plate-like projection(27) fixed at the lower center of the travelling base(22). (29) is a pair of guide rods in right-left direction supported on both ends by the support arms(31) which are fixed to the base plate (30), and is connected, in the middle, to a pair of right and left support arms(32) with ball slider fixed to the travelling base(22) so as to slide freely. (33) is a foot type air cylinder fixed to the base plate via a mounting leg, and the operation rod is connected to the travelling base drive arm(34) through the thread at the top end. By operating the air cylinder(33), therefore, the travelling base(22) can be moved horizontally along the guide rod(29). (35) is the stopper mounting base fixed to the base plate(30) to which the stopper(36) is attached so as the fixing position of the end can be adjusted freely. When the travelling base(22) is moved horizontally to the left direction by the air cyclinder(33) as mentioned above, the drive arm(34) comes in contact with the end of the stopper(36) to stop the motion. At this time, the travelling base(22) and the table(16) respectively come to their left limit positions of transfer. When the operation rod is pulled fully to the end by the air cylinder(33), on the other hand, the travelling base(22) and the table(16) come to respective right limit positions of their transfer. The upper and lower limit positions to the up-down transfer of the table(16) by the linear head(24) are regulated by the scaled and slitted gauge plate(38) attached vertically by the support plate(37) which is fixed on both ends to the lower face of the table(16) and to the projection attached to the travelling base(22) respectively, and by the photo-sensors(39)(39') made of the light source and light receiver attached to the said projection with the gauge plate(38) in-between so as to be adjusted freely in up-down directions. Though not illustrated, a photo-sensor to stop up-down motion of the table(16) by each pitch of the wafer housing groove of the cassette is provided on the table(16) and between the photo-sensors(39)(39') for lower limit transfer position setting, and the photo-sensor is mounted on the said projection in the same manner at slightly off-set position in front-rear direction from the photo-sensors(39)(39'). On the gauge plate(38), one each of slit hole of a little smaller than 1 mm in diameter is provided for the upper and lower limit position setting photo-sensors, and another slit hole along the scale for the photo-sensor at intermediate position at slightly off-set position in front-rear direction from the said slit holes. The gauge plate(38) can be used commonly for both wafers of 3" and 4" since the grooves of both cassettes are ordinarily made to the same pitch.

Figure 3:
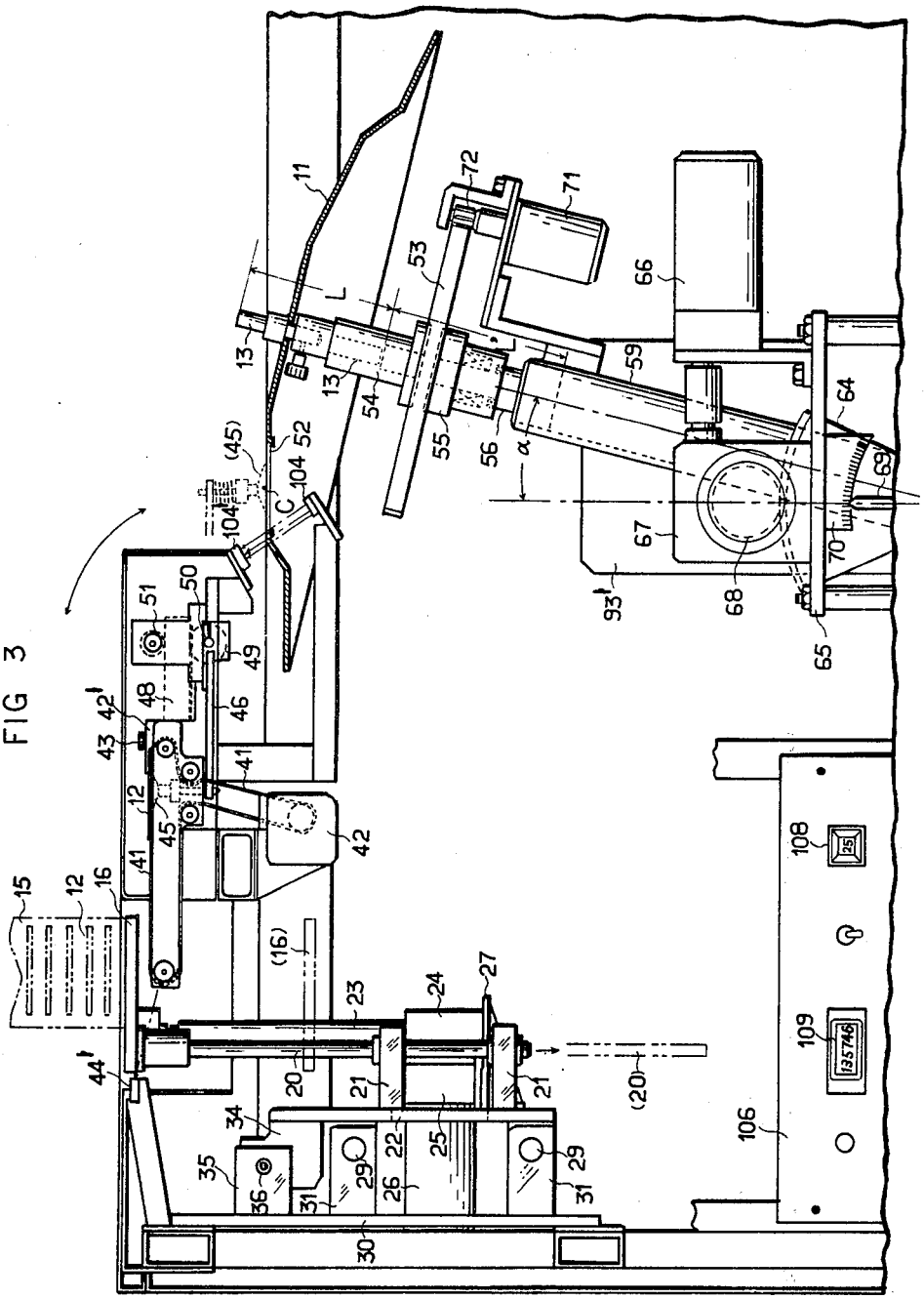
FIG. 3 is the partial side view of a wafer loading device according to this invention.

The belt conveyor mechanism for removing and positioning of wafers in the cassette and the rotary arm for transferring wafers are shown in FIGS. 3 and 6 and described below. (41) is the ring belt for wafer transfer comprising a driving pulley fixed to the output shaft of the driving small geared motor(42), an endless belt set on a pair of direction change pulleys and a pair of driven pulleys, and another endless belt set on another pair of driven pulleys turned and driven through the driven shaft. As the transfer belt(41), a clean ring belt such as a large sized 0 ring made of silicon rubber is used to prevent contamination of the wafer(12).

As shown in FIG. 6, the transfer belt(41) is so provided that the center line in travelling direction coincides with the center line of the square notch(17) at the left side of the cassette mounting table(16) placed at the right limit position. When the travelling base (22) is moved horizontally to the left limit position while keeping the table(16) at the upper limit position, which is higher than the upper travelling face of the transfer belt(41), the end position of the stopper(36) is so adjusted that the center line of the said transfer belt(41) coincides with the center line of the square notch(17) at the right side of the table(16). (42') is the stopper of the positioning fluoric resin plate to position the wafers(12) transfered by the belt(41) at the center, and the radius of the corners and the position are decided so as to fit to 3" wafer or 4" wafer respectively. Depending on the size of wafers(12), the stopper can be replaced and mounted easily with the mounting screw(43). (44)(44') are the sensors to detect wafers, (44) is the light source and (44') is the light receiving unit. This sensor functions to detect any wafer (12) housed in the cassette groove positioned right above the upper surface of the transfer belt(41) when the cassette (15) is mounted on the table(16). (45) is the sucker made of fluoric resin which comes in contact with wafers (12) when they are carried out by the transfer belt(41) and come in contact with the stopper(42') and stopped at the regular position from the back side. (46) is the transfer arm of the sucker(45). The top end of the rotary shaft(50) of the pinion(49) connected to the operation rod of the air cylinder(47) so as to make reciprocating motion in the arrow direction, and interlocked with the rack lever(48) is caught and fixed by L-shaped part of the said rotary transfer arm(46). The connection of the transfer arm(46) to the rotary shaft(50) is made adjustable. (51) is the guide roller of the rack lever(48) supported so as to turn freely. The pitch circle diameter of the pinion (49) is so set as to make ½ rotation to one stroke of the rack lever(48) by the air cylinder(47), and by the forward stroke, the rotary shaft(50) is turned clockwise by 180°. The connection of the said transfer arm(46) and the rotary shaft(50) is so adjusted that the rotary transfer arm(46) becomes horizontal when the rotary shaft(50) is turned counterclock-wise by 180° by the backward stroke and that the sucking face of the sucker(45) attached to the top end approximately coincides with the upper travel face of the wafer transfer belt(41). In this case, it is so arranged that the center of the sucker(45) coincides with the center of the wafer(12) positioned by the positioning stopper(42').

Now comes the description on the positioning device of the main shaft on which the wafer holding domes are mounted, together with the support shafts, so as to be dismounted freely.

In FIG. 3, the wafer holding dome(11) is shown by the center section. On the inner and outer concentric circles on the holding dome(11), more than one window type wafer mounting seats(52) are provided equally spaced apart. To 3" wafer, for instance, 9 seats on the inner circle and 16 seats on the outer circle, or 25 seats in all are provided, the size is slightly larger than the diameter of wafer(12) and the flange to support the wafer(12) on its periphery is provided at the bottom of each seat. (13) is the supporting shaft shown by the length L in the drawing and used as the rotation jig of the dome(11) in the above mentioned metal sublimation plating process. The lower end is inserted into the bushing(54) with flange fixed to the upper center of the indexing gear(53) so as to be dismounted freely. Though not shown in this drawing, more than one key grooves, four for example, are provided at the lower part of the supporting shaft for easy interlocking with the key fixed inside the hole of the bushing(54). (55) is a bushing with a flange that is fixed to the lower center of the indexing gear(53) and is interlocked with the stepped shaft(56) so as to turn freely. (71) is a pulse motor attached to the support base which is fixed to the main shaft(59) projecting from the upper part. The pinion(72) if fixed to the output shaft end of the motor so as to be interlocked with the gear(53). The main shaft(59) is made of a pipe having a stepped shaft(56) on the upper end, the lower part is formed into a two-way shaft plug(60). The shaft plug(60) is connected cross-wise to the rotating shaft(36), which is supported by the bearing bracket(62), which is fixed to the lift(61), so as to turn freely. (64) is a segment gear fixed to the end of the rotating shaft(63) and is interlocked with the pinion(68) fixed to the output shaft of the worm reduction gear(67) which is driven by the geared motor(66) with magnetic brake installed on the mounting base(65) at the upper part of the lift(61). When the geared motor(66) is turned, therefore, the pinion(68) turns clockwise or counter-clockwise and the rotating shaft(63) is turned clockwise or counter-clockwise through the interlocking segment gear(64), then the main shaft(59) is raised or tilted to the specified angle of inclination($\alpha$). (69) is the pointer fixed to the end of the rotating shaft(63), and the tilting angle($\alpha$) of the main shaft(59) to the vertical direction is indicated by this pointer on the scale of the angle scale plate(70) attached to the lower face of the mounting base(65). (73) is a pair of guide rod for up-down motion fixed to the reciprocating base(74) intermediated by the bushing with flange attached to the lower end. The upper part is connected to the bushing(75) with ball slider flange, fixed to the lift(61) passing through the lift, so as to slide freely up and down. (76) is the driving rod as the output shaft of the linear head(78) fixed to the reciprocating base(74), and the upper end is connected to the flange(77) fixed to the back side of the lift(61). (79) is a motor with magnetic brake mounted on the linear head(78) intermediated by the gear box. By driving the motor(79), the driving rod(76) moves up and down to transfer the lift(61) upward or downward. (80) is a pair of guide rails for right-left motion fixed to the base plate(81) to which a pair of right and left slide blocks(82) attached to the lower face of the reciprocating base(74) are connected so as to slide freely. (83) is the driving rod as the output shaft of the linear head(84) and the right end is connected to the reciprocating stand driving arm(85). The linear head (84) is fixed to the base plate(81) intermediated by L-shape mounting base(86). (87) is the motor with magnetic brake to drive the linear head(84). Accordingly, the driving rod(83) moves right and left when the motor(87) is turned to transfer the reciprocating base(74) right and left. (88)(89) are limit switches respectively fixed to the base plate(81) with mounting legs and plates in-between, and the limit switch (88) is to regulate the right limit position of the reciprocating base(74) and the limit switch(89) is to regulate the left limit position. (90)(91)(92) are photo-sensors respectively fixed to the base plate(81) with plates in-between in such manner that the fixing position can be adjusted freely. The photo-sensor(90) is for the positioning of the reciprocating base(74) at the right side transfer position to avoid interference with other members when the wafer holding dome(11) for 3" or 4" wafer is mounted on or dismounted from the bushing with flange with the support shaft (13) in-between, and the photo-sensor(91) is for positioning of the reciprocating base(74) at horizontal transfer position corresponding to the handling position of the center circle of the outer wafer mounting seat(52) on 4" wafer holding dome(11), and photo-sensor(92) is for the same purpose but of the center circle of the inner wafer mounting seat(52). At the back of the photo-sensors(91)(92), the photo-sensors(91')(92') for positioning of the reciprocating base(74) at horizontal transfer position corresponding to the handling positions of the center circles of outer and inner wafer mounting seat(52) on 3" wafer holding dome(11) are respectively fixed to the base plate(81) in the same manner as mentioned above with plates in-between. (93) is an inverted L-shape actuating piece to actuate the limit switches(88)(89) when it comes in contact with contactors with roller of the limit switches as the reciprocating base(74) transfers and also to shut off the light from photo-sensors(91)(91')(92)(92') and to make the sensors to transmit detection signal output when it goes into the clearance between the light source and the light receiving unit of these sensors. Fixed to the reciprocating base(74) in addition, with respective mounting plates in-between, though not shown in the drawing, are one each of limit switch to regulate the upper and lower limit positions to up-down motion of the lift base(61), the photo-sensor for the positioning of the lift base(61) at an up-down transfer position to prevent interference with other members when 3" and 4" wafer holding dome(11) is mounted or dismounted as described above, and two sets each of photo-sensors for positioning of the lift base(61) corresponding to the handling position of center circles respectively of the inner and outer wafer mounting seats of 4" and 3" wafer holding dome(11).

Figure 4:
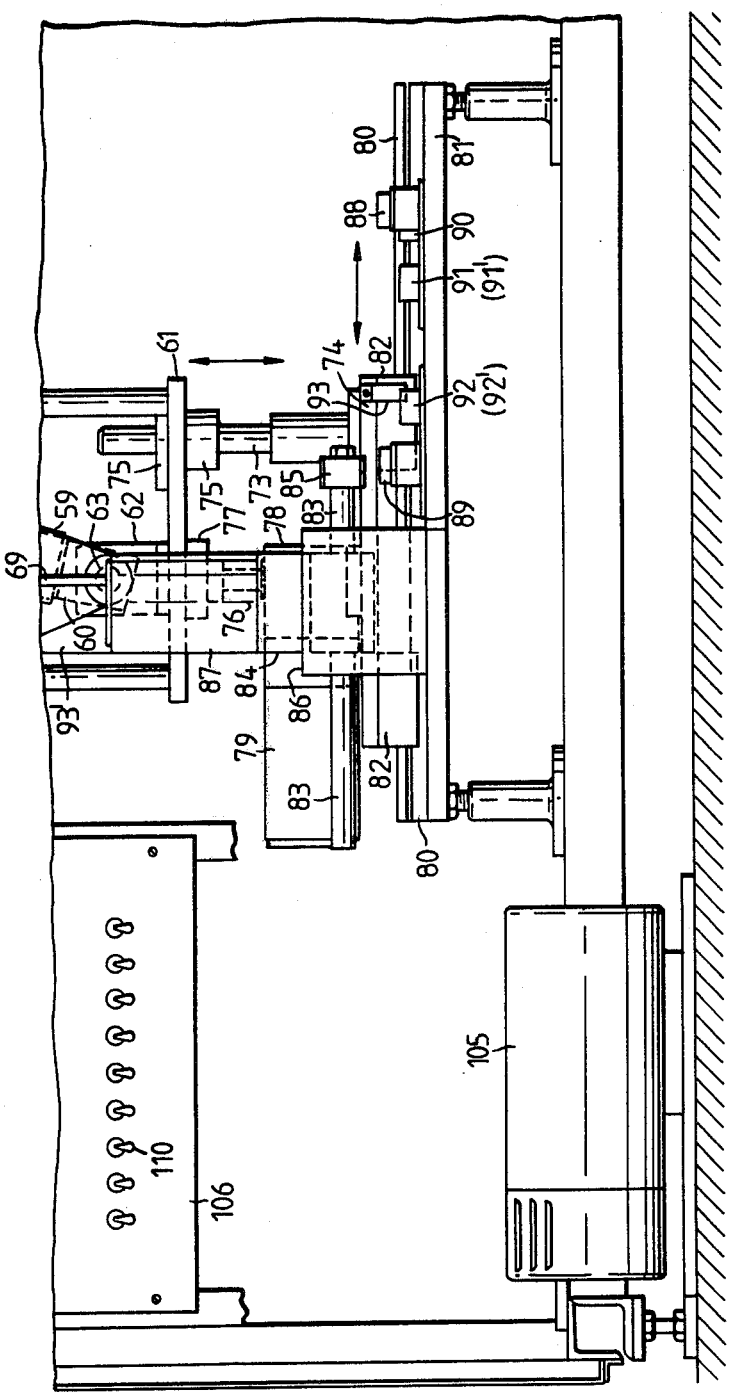
FIG. 4 is the partial side view showing the lower half of FIG. 3.
Figure 8:
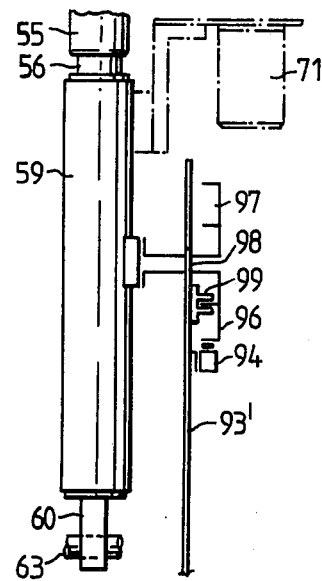
FIG. 8 is the partial side view of the spindle tilting angle regulating mechanism.
Figure 9:
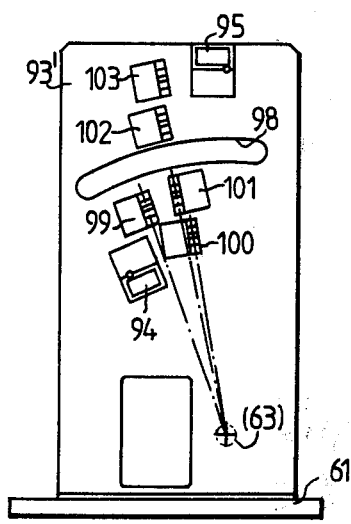
FIG. 9 is the front view of the mounting plate of photo-sensor and limit switch for main shaft tilting angle detection.

FIG. 8 is the partial side view of the tilted angle regulating mechanism of the main shaft(59) and FIG. 9 is the front view of the angle detection photo-sensor and of the limit switch mounting plate. (93') is the mounting plate for the angle detection photo-sensor and the limit switch fixed to the lift base(61). (94)(95) are the limit switches to regulate the tilting angle of the main shaft(59) at its left limit and right limit positions respectively, and (96)(97) are the actuating pieces attached to the main shaft(59) vertically and swing right and left along with the tilting motion of the main spindle(59) passing through the circular opening(98) on the mounting plate(93') to actuate the contact rollers of the limit switches(94)(95) respectively. (99)(100)(101)(102) and (103) are the photo-sensors attached to the mounting plate(93') so as the optical axis from respective light source is directed to the rotating center of the rotary shaft(63). The photo-sensor(99) is to fix the tilting angle of the main shaft(59) so as to prevent interference with other members when 3" and 4" wafer holding dome(11) is mounted or dismounted as described above, and photo-sensor(100) and (101) are to fix the tilting angle of the main shaft(59) corresponding to the handling positions of the center circles of inner and outer wafer mounting seats(52) respectively of 3" wafer holding dome(11). Photo-sensors(102)(103) are for the same purpose as above but to 4" wafer holding dome(11). These photo-sensors are actuated when the actuating piece(96) or (97) goes into the gap between respective light source and the light receiving unit to shut off the light path. The sets of photo-sensors (104)(104') at lower right of the rotary transfer arm(46) shown in FIG. 3 are for the detection of the rotary position of the wafer holding dome(11) around the rotating center of the support shaft(13) and for the index positioning by each pitch of the center circle of the wafer mounting seat(52) on the holding dome(11) at the handling position. The vacuum pump(105) shown at lower left in FIG. 4 is for vacuum drawing of the sucker(45). (107) is the adjusting panel and control box and the one shown at lower left in FIG. 6 is the operation panel(107) installed on the surface of this equipment for easy operation. (108) is a preset counter to preset the number of sheets of wafers(12) loaded to the wafer holding dome(11) and to repeat handling operation automatically to the preset number of sheets. (109) is the counter to indicate the total number of sheets of wafers(12) handled. (110) is the snap switch for single control operation of each driving unit, (111) is the main switch for power source, and (112) is the change-over switch of handling operation, turned to left for loading motion and to right for handling mode change-over. (113) is a select switch to select signals from each sensor corresponding to the wafer size handled, turned to left, for example, for corresponding operation to 3" wafer and to right for corresponding operation to 4" wafer, thus the right-left and up-down positions as well as the tilting angle of the wafer holding dome(11) are decided. (114) is the automatic operation start switch.

OPERATION

Now follows description on the operation of this apparatus, first taking, for example, the loading operation to transfer wafers(12) one by one from the cassette(15) containing twenty-five sheets of 3" wafers to the wafer holding dome(11) for 3" wafer having nine wafer seats(52) on the inner circumference and sixteen seats on the outer circumference.

The up-down position of the lift(61), right-left position of the reciprocating base(74) and the tilting angle of the main shaft(49) that determine the position of the bushing(54) with flange into which the support shaft (13) of the wafer dome(11) is inserted are to be set respectively at the setting positions for mounting and dismounting of the wafer holding dome(11) and at the setting angle. The mounting position of photo-sensor(92'), for example, to the reciprocating base(74), and of photo-sensor(100) to the tilting angle are to be adjusted in advance so as the center (C) of the sucker(45) shown in FIG. 3 by the alternate long and two short dashes line comes onto the center circle of the inner wafer mounting seats(52) on the dome(11). The mounting position of photo-sensor(91'), for example, to the reciprocating base(74), and of photo-sensor(101) to the tilting angle are also to be adjusted preliminary so that the said center(C) comes onto the center circle of the outer wafer mounting seats (52) on the dome(11). Fix the cassette(15) containing wafers(12) with their sublimation surface upward by interlocking the notch(19) on the bottom of the side plate of the cassette and the cassette positioning dog(18) with the square notch(17) at the left side of the mounting table(16) kept at the upper limit position. While the holding dome(11) for 3" wafer to which the support shaft(13) is attached is mounted on the bushing(54) with flange so as the key way of the support shaft(13) is connected to the key of the bushing(54) with flange.

Turn on the main power switch(111), set the preset counter(108) at 25, turn the handling operation change-over switch(112) in left direction to loading, turn the selection switch(11) in left direction to select corresponding operation for 3" wafer, and also turn on the auto-operation shaft switch(114). By such operation of the control panel (106) and operation panel(107) as described above, the following operations are carried out respectively in order.

(a) Up-down positioning of the lift base to align the center circle of the outer wafer mounting seat on the dome to the handling position:

First the motor(79) with magnetic brake is driven and the drive rod as the output shaft of the linear head (78) is pushed upward, then the lift(61) is raised guided by the pair of up-down guide rods(73). When the actuating piece (not illustrated) attached to the lift(61) shuts off the light path of the said positioning photo-sensor (not shown) provided corresponding to the handling position of the center circle of outer wafer mounting seats(52) on 3" wafer holding dome(11) by this upward motion, the motor(79) stops, the brake is applied at the same time, and the lift(61) is held firmly at the specified height for up-down positioning of the lift.

(b) Inclined positioning of the main shaft to align the center circle of outer wafer mounting seat with the handling position:

Then the geared motor(66) with magnetic brake is turned, the pinion(68) is subjected to deceleration rotation in counterclock-wise direction through the worm reduction gear(67), and the rotary shaft(63) is turned clockwise intermediated by the segment gear(64) interlocked with the pinion, then the main shaft(59) is inclined to the right. Along with the tilting of the main shaft(59), the light path of the photo-sensor (101) is shut off by the actuating piece(96), then the geared motor(66) stops and the brake is applied at the same time to hold the main shaft(59) at the inclined angle, thus the inclined positioning of the main shaft completes.

(c) Positioning of the reciprocating base in right-left direction to align the center circle of the outer wafer mounting seats on the dome with the handling position:

Then the motor(87) with magnetic brake is turned and the drive shaft rod(83) as the output shaft of the linear head(84) is moved to the left, and the reciprocating base(74) is moved to the left along the guide rail(80) through the reciprocating drive arm(85). When the actuating piece(93) shuts off the light path of the photo-sensor(91') by this movement of the reciprocating base, the motor(87) stops, brake is applied at the same time, and the reciprocating base (74) is fixed at the left side position, thus the right-left positioning of the reciprocating base completes.

By the above positioning motions from (a) to (c), the center circle of outer wafer mounting seat(52) on the dome always goes through the said center(C) whenever the dome(11) is turned and the flange face at the bottom of the wafer mounting seat(52) is kept horizontal.

Figure 10:
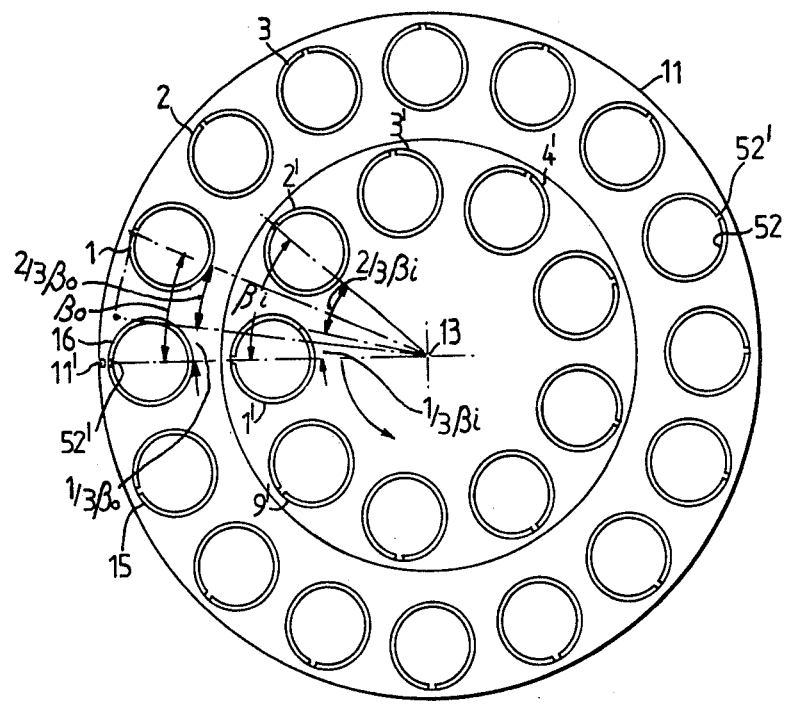
FIG. 10 is the schematic top view of the holding dome for 3" wafer.

(d) Positioning of rotation center of dome:

FIG. 10 is the schematic top view of 3" wafer holding dome in which wafer mounting seats(52) are equally spaced, 16 seats on the outer circle and 9 seats on the inner circle respectively, and only the centers of each inner and outer wafer mounting seats(52) are placed on a concentric circle of the holding dome(11). The notch(11') as the rotation center is provided on the periphery of the radius, and the center circle of the outer wafer mounting seat(52) goes through the above mentioned center(C) by the positioning operation of the above (a) to (d). The mounting position of photo-sensors, however, are adjusted preliminarily so as the center of the wafer mounting seat(52) adjacent to the said notch(11') coincides with the said center(C) when luminous flux from the projector(104') of the sets of photo-sensors(104)(104') installed at lower right of the wafer mounting device shown in FIG. 3 passes through the said notch(11') and is caught by the receiver(104'). When the pulse motor(71) is driven, the bushing with flange(54) is turned intermediated by the pinion(72) and indexing gear(53), and the wafer holding dome(11) is also turned with the support shaft(13) in-between. When the notch(11') as the reference point is detected by the said photo-sensors (104)(104'), the rotation of the pulse motor(71) is suspended by the detection signal, and positioning of the rotary center of the dome is made by the water holding dome(11) held at the position. In this case, the notch(11') as the reference point on the periphery of the dome(11) is placed on the extention of the center line of the transfer belt(41).

(e) Rotational positioning by one pitch to outer row on dome:

If the gear ratio between the indexing gear(53) and the pinion(72) is R, the number of pulse required for one rotation of the pulse motor(71) is N, the number of wafer mounting seat(52) arranged respectively on the inner and outer circles on the wafer holding dome (11) is M and M' respectively, the pulse of NR/M to the inner circle and of NR/M' to the outer circle must be supplied to the pulse motor(71) as the input to index the wafer holding dome(11) positioned at the said rotational center corresponding to the respective number of wafer mounting seats(52).

If, for example, N=120, R=24, M=9 and M'=16, the rotational indexing by one pitch to the wafer holding dome(11) is made by supplying 120.24/.9=320 pulses to the inner circle and 120.24/16=180 pulses to the outer circle to the pulse motor(71) respectively as the input.

Since the accuracy of this indexing is greatly affected by the back-lash of the gear interlocking and the intensity of the inertia moment of the rotating unit at the same time, the rotational direction at indexing is kept only into one direction, counterclockwise for example, and the rotation speed before stopping is lowered so as the final positioning by the photo-sensor(104)(104') is made by accurate indexing. Though the former may need no further description, the latter will require some more explanation. That is, the number of pulse equivalent to ⅔ of the pitch of the outer wafer mounting seats on the wafer holding dome (11) is set preliminarily in the sequence control circuit. When the dome(11) is turned by ⅔$\beta_o$ angle in counterclockwise direction by the pulse motor(71), therefore, the frequency of the pulse supplied to the pulse motor(71) as the input is changed over to lower frequency and the rotational speed is substantially lowered. In other words, the arrangement is so made that the pulse motor(71) turns at high speed for 120 pulses, as an example, at rotational indexing of one pitch of the outer wafer mounting seats(52) on the dome(11) and at low speed for the remaining 60 pulses, and the pulse motor(71) comes to a stop when the notch(52') of the wafer mounting seat(52) is caught by the photo-sensors (104)(104').

(f) Transfer belt feed-out operation:

Then the small sized geared motor(42) is driven, the driving pulley is turned clockwise, and the transfer belt(41) is operated in the direction of wafer feed-out, i.e. to the sucker(45) at the stand-by position, and this operation continues until the wafers(12) housed in the cassette(15) are loaded onto the wafer holding dome(11) completely.

The above mentioned operations from (a) to (f) are the preparatory sequence for wafer loading.

Now, in the following text, the taking-out and feed-out of wafers themselves(12) from the cassette(15) by the transfer belt and the transfer motion by the sucker(45) from the transfer belt(41) to the wafer holding dome(11) are described altogether.

When the motor(26) is driven and the drive rod(23) is moved downward intermediated by the linear head(24), the table(16) held at the upper limit position with the cassette(15) mounted is lowered. At this time, the wafers housed in the cassette(15) are detected by the photo-sensors(44)(44'), the luminous flux of the projector is caught by the receiver of the photo-sensor provided between the photo-sensors(39)(39') through the slit on the gauge plate(38) that goes down together with the table(16), and when both of these sensors are actuated, the motor(26) is suspended, the downward motion of the table(16) stops, and the wafer at the lowermost stage of the wafer housing groove of the cassette(15) is took out by the transfer belt(41) during the period and is transfered to the sucker(45) at the stand-by position. When the wafer(12) comes in contact with the positioning stopper(42'), it stops at the position slipping off the running belt(41). Since the sublimation surface of the wafer(12) is faced upward, fine scratch on the lower face of the wafer(12) by the above slipping causes no problem. When the center of the wafer(12) is then sucked by the sucker(45) at the stand-by position on the center of the lower face, the air cylinder(47) functions to turn the rotary transfer arm(46) with the sucker(45) clockwise as shown by the arrow. Then the wafer(12) is turned over, and the center is aligned to the center point(C), i.e. to the outer wafer mounting seat(52) on the wafer holding dome(11), that is the mounting seat(52) of ① of which center is placed on the center point(C).

After that, the vacuum drawing by the sucker(45) is released, the wafer(12) is dropped into the mounting seat so that the periphery is held by the bottom flange of the wafer mounting seat(52), thus the transfer to the wafer holding dome(11) is completed. After the wafer transfer, the sucker(45) is returned to the stand-by position as the rotary transfer arm(46) is turned 180° counterclock-wise as shown by the arrow by the return stroke of the air cylinder(47). At the same time, the rotational indexing in counterclock-wise direction by one pitch of the above mentioned outer wafer mounting seat(52) is carried out to the wafer holding dome(11). When the motor(26) is driven following the above, the table(16) is lowered as described above, and during the lowering, the wafer(12) housed in the cassette(15) is detected by the photo-sensors(44)(44'), and at the same time, the slit provided on the slit gauge plate(38) that goes down together with the table(16) corresponding to the pitch of the wafer housing groove is also detected by the photo-sensors, and the motor(26) is suspended by these two detection signals, and the table(16) is held at the position lower by one pitch of the wafer housing groove of the cassette(15) from the previous stop position.

During this time, the 2nd wafer(12) from the bottom housed in the cassette(15) is taken out by the transfer belt(41). Then the same operations are repeated again to transfer the taken out wafer(12) to the wafer mounting seaat(52) at the outer circle ② of the wafer holding dome(11). The wafers(12) housed in the grooves of the cassette(15) are taken out one by one from the bottom to be transferred to the outer positions ①, ②, ③, ... on the wafer holding dome(11) one after another. When the wafer(12) housed in the 16th groove from the bottom of the cassette is transferred to the wafer mounting seat(52) at ⑯ position adjacent to the reference point notch(11'), the charging of the whole wafers(12) to the outer wafer mounting seats(52) completes. When the photo-sensors(104)(104') detect that the reference point notches(11') are reset after one round, the positioning of the center circle of the inner wafer mounting seats to the handling position is carried out in the same manner as the positioning from the above (a) to (c) made to the center circle of the outer wafer mounting seats on the dome. When the wafers(12) housed in the grooves of the cassette(15) are transferred by each sheet starting from 17th from the bottom by the same operation as described above to the wafer mounting seats at inner positions ①', ②', ③' ... on the wafer holding dome(11) one after another, and the wafer(12) housed in the 25th groove from the bottom of the cassette(15) is transferred to the mounting seat(52) at position ⑨', the charging of the whole wafers(12) to the inner wafer mounting seats (52) completes. When the sheet of wafers(12) loaded from the cassette(15) to the wafer holding dome(11) reaches 25, the preset counter(108) functions to complete the loading operation. Then the wafer holding dome(11) after completing wafer loading is removed manually together with the support shaft(13) and transferred, for example, to sublimation process when the up-down position of the lift(61), right-left position of the reciprocating base(74) and tilting angle of the main shaft(59) are returned respectively to the original setting position and setting angle for mounting and dismounting.

Then the wafers(12) after sublimation process are unloaded from the wafer holding dome(11) in preparation for the next process and are housed in the cassette in the following manner.

First an empty cassette(15) is mounted at the left notch(17) of the table(16) as described above, the handling change-over switch(112) is turned in right direction for unloading, and the auto-operation start switch(114) is turned to ON. Prior to the start of unloading operation, up-down position of the lift(61), right-left position of the reciprocating base(74) and also the tilting angle of the main shaft(59) are set at the setting position and setting angle for mounting and dismounting of the wafer holding dome(11) as described above. When the motor(26) is driven, the drive rod(23) is driven downward through the linear head(24), the table(16) held at the upper limit position with the empty cassette(15) mounted is lowered, and the photo-sensor(39') detects the slit on the gauge plate(38) going down together with the table(16), the motor(26) is suspended by the detection signal, and the table(16) is held at the lower limit position. Then the motor(26) is driven in reverse direction and the table(16) is lifted, and when the photo-sensor provided between the photo-sensors(39)(39') detects the slit on the gauge plate(38) in the same manner as described above, the motor(26) is stopped by the detection signal, the table(16) is stopped at a higher position than the lower limit by one pitch of the wafer housing groove of the cassette(15) for standby. At this stand-by position of the table(16), the wafer housing groove at the upper-most stage of the casette(15) mounted on the table is placed slightly lower than the transfer surface of the transfer belt(41). Then the small sized geared motor(42) is turned in reverse direction as the above, and the transfer belt(41) is operated so as to run the transfer belt(41) toward the cassette(15) at the stand-by position. This operation continues until the wafers(12) held in the wafer holding dome(11) are unloaded to the cassette(15) completely. After that, each operation from (a) to (d) for the loading follows exactly in the same manner, and as for the operation of (e), i.e. the rotational positioning by one pitch to outer circle on the dome, the rotary indexing is made for unloading in the same accuracy for the above loading. When the air cylinder(47) is then operated and the sucker(45) at the stand-by position is fitted to the outer wafer mounting seat(52) at ① position on the wafer holding dome(11) by turning the rotary transfer arm(46) clockwise by 180° as shown by the arrow, vacuum drawing is carried out to draw the wafer(12) held at the wafer mounting seat(52) at the ① position. When the rotary transfer arm(46) is turned counterclockwise by 180° by the return stroke of the air cylinder as shown by the arrow and the sucker(45) returns to the stand-by position, the vacuum drawing is released, the wafer(12) drawn to the sucker(45) is delivered to the transfer belt(41) and is further housed in the upper-most stage of the wafer housing grooves of the cassette at the stand-by position by the belt(41).

Following the above, the table(16) is lifted by one pitch of the housing groove of the cassette(15) in the same manner as described before, and the cassette(15) is placed to the next stand-by position. Then the same operations as described above are performed and the wafer(12) held at the ② position of the outer wafer mounting seat(52) on the wafer holding dome(11) is housed to the 2nd groove from the top of the cassette(15). The wafers(12) held by the wafer holding dome(11) are taken out one after another from the wafer mounting seats(52) positioned at ①, ②, ③, ... on the outer circle in counterclock-wise direction to be housed in the wafer housing grooves of the cassette(15) in order, and the wafer(12) held at the wafer mounting seat(52) at position ⑯ adjacent to the reference point notch(11') is housed into the 16th groove from the top of the cassette (15), thus the wafers(12) held at the outer wafer mounting seats(52) are housed into the cassette(15) completely. Then follows the positioning operation to place the center circle of the inner wafer mounting seats on the dome to the handling position in the same manner as described before, and then rotational positioning by one pitch to the inner circle of the dome is performed.

In the same manner as described above, the wafers(12) are taken out of the wafer mounting seats(52) positioned at ①, ②, ③ ... of the inner circle of the wafer holding dome(11) one after another to be housed in the wafer housing grooves of the cassette(15), and the wafer(12) at the mounting seat(52) of the ⑨ position is housed to the 25th groove from the top of the cassette(15), thus the wafers(12) held at the inner wafer mounting seats(52) are housed into the cassette(15) completely.

By this apparatus, it is also possible to carry out the above mentioned unloading operation to the dome(11) first, then the above described loading operation, if an empty cassette(15) is mounted on the notch(17) at the left side of the table and a cassette(15) charged with wafers(12) on the notch(17) at the right side, and also the wafer holding dome(11) charged with the wafers(12) already subjected to sublimation process, for example, is mounted on the bushing(54) with flange with the support shaft(13) in-between.

Continuous operation of such motion needs some more description as follows.

In this case, the handling operation change-over switch (112) is turned to the center position to keep it at the handling mode of continuous operation. Then the select switch(113) is turned to left to handle 3" wafers for the operation corresponding to 3" wafer and the auto-operation start switch(114) is turned to ON. By this arrangement, the above mentioned unloading operation is first carried out, all the wafers held at the wafer mounting seats(52) on the wafer holding dome(11) are housed in the housing grooves of the empty cassette(15) mounted on the notch(17) at the left side of the table(16). When the unloading operation completes, the air cylinder(33) functions to push the reciprocating base drive arm(34) connected to the operation rod to the left side. By this motion of the reciprocating base drive arm(34), the reciprocating base (22) is moved horizontally to the left side along the guide rod(29) intermediated by the support arm(32). When the drive arm(34) comes in contact with the end of the stopper (36), the transfer stops and the table(16) is placed at the left limit position. In other words, the cassette(15) charged with wafers(12) and mounted on the notch(17) at the right side (the spare notch) is placed to the position where the center line is aligned with the travelling center of the transfer belt(41).

Then follows the loading operation to the cassette(15), all the wafers(12) housed in the wafer housing grooves are transferred to the wafer mounting seats(52) on the empty wafer holding dome(11), and the continuous operation stops when the loading motion completes.

All of the above descriptions are for the handling of 3" wafers, but for handling of 4" wafers, the same operation is applicable by using the positioning dog(18') to mount the cassette(15) for 4" wafer on the table(16), attaching the stopper(42") for 4" wafer, and by using the wafer holding dome(11) for 4" wafer with wafer mounting seats(52), for example five seats on the inner circle and 12 seats on the outer circle, equally spaced apart each other.

What is claimed is:

1. An apparatus for mounting wafers to be treated for sublimation plating respectively in order onto a plurality of wafer mounting seats, including a wafer cassette for storing said wafers therein, said cassette being driven vertically at the same intervals as wafer mounting; a rotary arm for mounting said wafers one by one on the mounting seats; a conveyor mechanism for conveying said wafers to a rotation locus of said rotary arm, said conveyor mechanism having two belts stretched between said cassette and said rotation locus; and wafer holding means for holding said wafers at said mounting seats which are provided thereon, said holding means comprising a circular dome on which said mounting seats are circularly aligned in at least two rings and a center shaft connected to said dome at the center thereof to rotate said dome, said shaft being driven for up and down movement, horizontal movement, and inclination thereof depending on what ring a mounting seat that receives a wafer belongs to, and said shaft indexing mounting positions depending on how many mounting seats are provided in a ring, so that respective mounting seats are kept horizontal at a mounting position of said wafers.

2. An apparatus according to claim 1, wherein said mounting seats respectively comprise a hole hollowed out from the dome, through which respective wafers are treated by sublimation plating; a circular step provided at the peripheral edge of said hole, on which respective wafers are supported; and a notch provided at a specific position of said circular step that corresponds to a radial line of the dome permitting the first index of the mounting position to be determined.

3. An apparatus according to claim 1, wherein said rotary arm comprises a suction mechanism, respective wafers being firmly held on said arm during the transfer of said wafers from the conveyor mechanism to the mounting seats.

4. An apparatus according to claim 1, wherein said dome is variable in rotation rate, so that, when said wafers are mounted onto a radially outer ring of said dome, the rotation rate of said dome is decreased, and, when they are mounted onto a radially inner ring thereof, the rotation rate is increased.

* * * * *